(12) United States Patent
Cases et al.

(10) Patent No.: US 7,791,227 B2
(45) Date of Patent: Sep. 7, 2010

(54) ELECTROMAGNETIC MORPHING APPARATUS FOR HOT PLUGGABLE ARCHITECTED SYSTEMS

(75) Inventors: Moises Cases, Austin, TX (US); Byron L. Krauter, Round Rock, TX (US); Bhyrav M. Mutnury, Austin, TX (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 11/858,663

(22) Filed: Sep. 20, 2007

(65) Prior Publication Data

US 2009/0079274 A1 Mar. 26, 2009

(51) Int. Cl.
*H01B 7/30* (2006.01)
(52) U.S. Cl. .................................. 307/147
(58) Field of Classification Search ............... 307/147
See application file for complete search history.

(56) References Cited

U.S. PATENT DOCUMENTS 7,325,983 B1 * 2/2008 Dallesasse et al. ............ 385/92

* cited by examiner

*Primary Examiner*—Robert L. Deberadinis
(74) *Attorney, Agent, or Firm*—The Brevetto Law Group

(57) ABSTRACT

In electronic devices with signal traces positioned between a ground layer and a voltage reference layer, systems and methods are provided for connecting a hot pluggable device to the electronic device in a manner that diminishes signal degradation due to parasitic effects. The first device has a second reference layer near the connector that connects to a second device voltage reference layer maintained at a given voltage level across the connector. In the first device near the connector the signal trace is positioned in between a ground layer of the first device and the second reference layer which is maintained at a given voltage by a voltage regulator of the second device. The signal return current travels past the second reference layer to a first reference layer of the first device which is maintained by the first device's voltage regulator through AC decoupling capacitors minimizing the current return path discontinuity.

20 Claims, 6 Drawing Sheets

ELECTROMAGNETIC MORPHING APPARATUS FOR HOT PLUGGABLE ARCHITECTED SYSTEMS

BACKGROUND

1. Field

The present invention relates to electrical devices, and more specifically, to the circuitry in electrical devices for accommodating hot pluggable electrical devices.

2. Description of Related Art

Signal routing in high frequency systems can be challenging. Parasitic effects that can be ignored at lower frequencies become more pronounced at higher frequencies. Over the years circuit designers have developed various circuitry configurations in an effort to reduce parasitic effects. One engineering solution that reduces parasitic effects is the use of microstrip signal traces for circuitry and transmission lines. Microstrip signal traces are routed above (or below) a single reference layer such as a ground layer. The microstrip signal layer is often separated from the ground layer by a dielectric layer. Microstrip traces can be routed on either side of a given reference layer, or on both sides of the same reference layer. One drawback of microstrip is that the circuitry and transmission lines sometimes induce cross-talk, coupling noise into the signals. Microstrip can also be subject to higher levels of electromagnetic interference (EMI) as compared to other circuitry configurations designed to reduce parasitic effects such as stripline.

FIG. 1A depicts a stripline circuitry configuration, another popular configuration for mitigating parasitic effects. Stripline signal traces are routed between two reference layers, for example, between two ground layers or between a ground layer and a voltage reference layer (which may be called a power reference layer). In FIGS. 1A-B signal trace 101 is routed between reference layer 103 and ground layer 105. The voltage of reference layer 103 is connected to a voltage regulator module 107 to maintain a voltage of $V_{DD}$. FIG. 1B is a circuit diagram corresponding to the stripline configuration of FIG. 1A. The stripline signal trace is typically separated from each of the two reference layers by insulative layers 109 and 111. The insulative layers may be dielectric substrate layers. Stripline tends to result in less noise coupling, better current return, more uniform field distribution, and better signal quality than microstrip. One drawback of it is that stripline circuits and transmission lines tend to have higher attenuation due to dielectric loss as compared to some other circuitry configurations.

The choice of whether to use a stripline signal trace with two ground layers or else a ground layer and a voltage layer sometimes depends upon the circuitry characteristics. Typically, with a push-pull driver, it is better practice to route stripline signals between power and ground layers, as shown in FIG. 1A, rather than using two ground layers. Using power and ground layers provides an efficient current return path. For example, an input/output (I/O) circuit using a push-pull type of driver has current return paths through either the power layer or the ground layer, depending on signal voltage transitions that are not harmoniously coupled with the ground-ground layer selection. An on-chip (or on-package) decoupling capacitor scheme can help mitigate the signal noise issues associated with current return path. But there is usually little or no available space on the chip to accommodate the amount of capacitance needed.

On the other hand, routing signals in a signal layer between a power layer and a ground layer is not always a viable solution due to the circuitry requirements of hot-pluggable devices. Hot plugging—sometimes called hot swapping—means that a component or peripheral of a device (e.g., keyboard of a computer or other peripheral device) can be plugged in, or removed and replaced, without powering the device down. Many of the latest keyboards, hard drives and other computer peripherals are hot pluggable and can be plugged in on the fly, without powering down the computer or rebooting it. Universal Serial Bus (USB) devices are hot swappable. While this is very convenient for users, hot pluggable components often suffer signal degradation of high frequency signals due to parasitic current effects in combination with the connector geometry. Hot-pluggable devices must have their own on-board voltage regulator module (VRM). The requirement of having multiple VRMs, and the current return path discontinuities caused by the connectors, often results in signal perturbations due to parasitic effects.

Today, hot-pluggable devices are becoming increasingly popular. The ability to swap out hot pluggable devices on the fly is useful in fixing system malfunctions without interrupting system operation. However, the conventional circuitry and board design practices for connecting hot pluggable devices create discontinuities in current return paths due to the use of multiple voltage regulator modules, printed circuit board complexities, and connector and decoupling capacitor geometries. These, in turn, cause signal degradation in conventional devices and hot pluggable devices. What is needed is a way to reduce the signal degradation of hot-pluggable devices that operate at high frequencies.

SUMMARY

Embodiments disclosed herein address the above stated needs by providing apparatus and methods for reducing the signal degradation of signals routed from hot pluggable boards with one or more voltage regulator modules. In accordance with various embodiments an electronic device is provided having a first signal trace that is removably connected to a second signal trace of a hot pluggable device via a connector. The electronic device has a first ground layer that is removably connected to a ground layer of the hot pluggable device. In one embodiment the electronic device also has first and second reference layers, each of which are configured opposite the first ground layer so as to be on either side of the signal trace in different portions of the electronic device. The second reference layer footprint surrounds the connector. The second reference layer of the electronic device is removably connected to a third reference layer of the hot pluggable device that is maintained at a given voltage by a voltage regulator of the hot pluggable device. The first reference layer is connected to voltage regulator of the electronic device. The first and second reference layers are not directly electrically connected—that is, direct current cannot flow between them. However, in some embodiments the first reference layer may be connected to the second reference layer by one or more decoupling capacitors.

In another embodiment the electronic device has a first reference layer which is only configured opposite the first ground layer so as to be on either side of the signal trace. The hot pluggable device however, has second and third reference layers, each of which are configured opposite the second ground layer so as to be on either side of the signal trace on different portions of the hot pluggable device. The second reference layer footprint surrounds to the connector. The first reference level of the electronic device is removably connected to the second reference layer hot pluggable device. The second and third reference layers are not directly electrically connected—that is, direct current cannot flow between them. However, in some embodiments the second reference layer may be connected to the third reference layer by one or more decoupling capacitors.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1A:
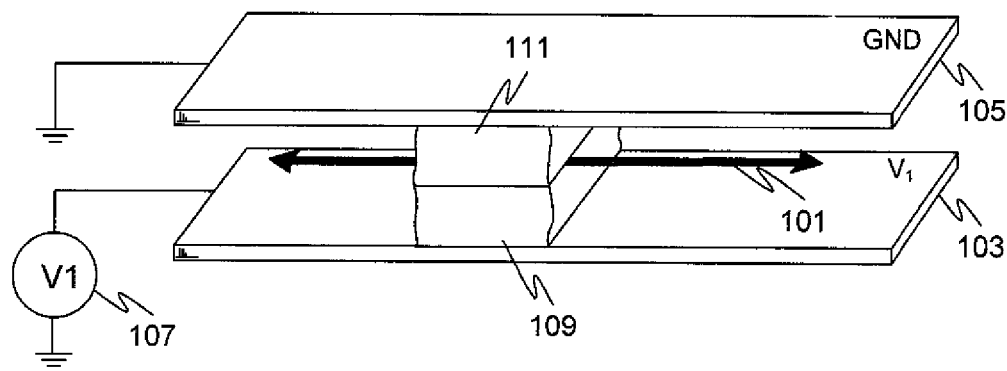
FIGS. 1A and 1B depict two views of a conventional circuitry configuration for reducing parasitic effects in a transmission line.
Figure 1B:
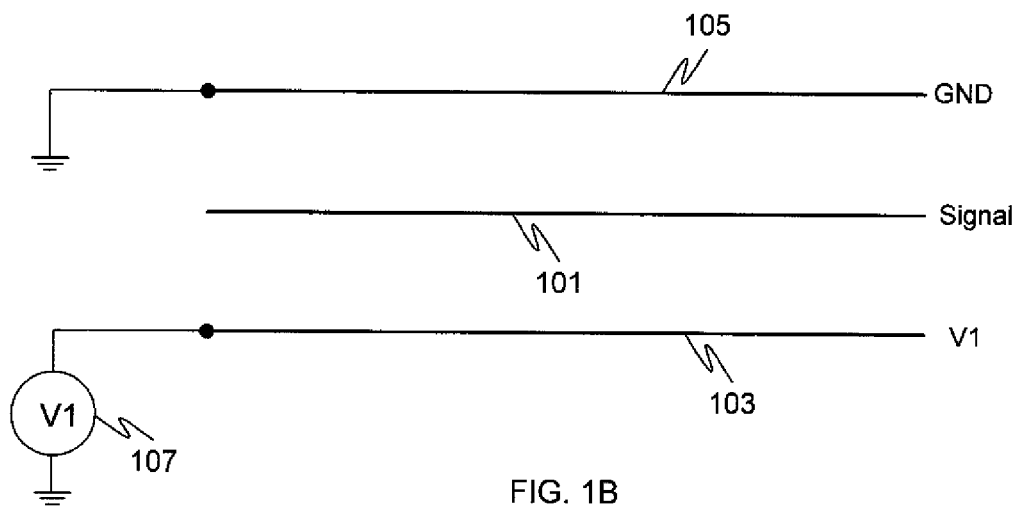
Figure 2A:
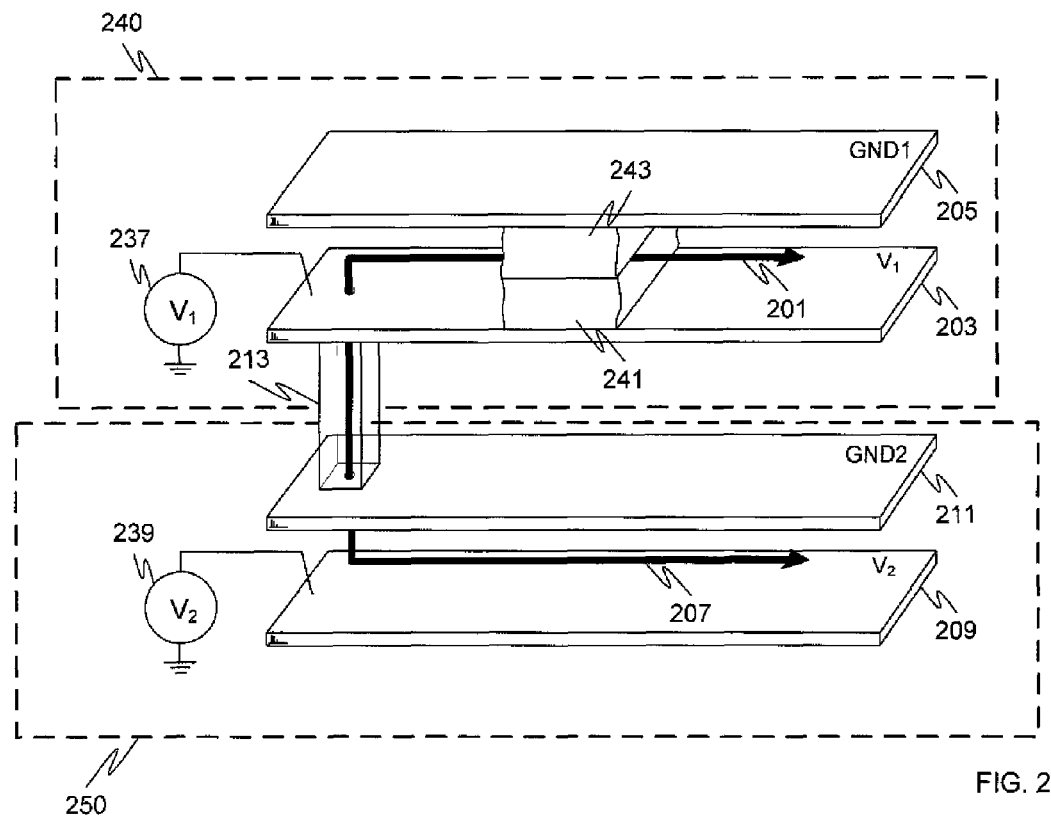
FIGS. 2A and 2B depict two views of a circuitry configuration for routing a signal through a connector from a hot pluggable device to another device.
Figure 2B:
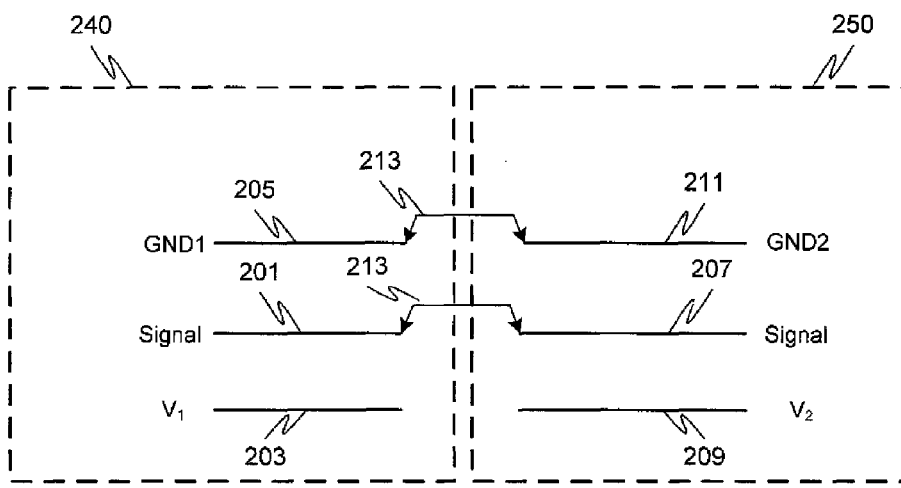

FIGS. 2A and 2B depict a circuitry configuration for routing a signal through a connector 213 from a hot pluggable device 240 to another electronic device 250. The signal path 207 on the electronic device 250 is connected to the signal path 201 on the hot pluggable device by way of connector 213. The signal traces are often positioned between, and insulated from, the reference layers by insulative layers such as the dielectric layers 241 and 243 shown for signal trace 201. For illustrative purposes, the dielectric layers 241 and 243 are shown only for a portion of signal trace 201. In practice the dielectric layers may run the length of the signal trace to provide support and insulate it from the reference layers in both the hot pluggable device 240 and the electronic device 250.

The present inventors realized the signal degradation due to return path discontinuities associated with disparate reference layers as the signal traces connect from the electronic device 250 through connector 213 to the hot pluggable device 240 could be mitigated more effectively than the current practice of decoupling reference layers at the connector itself. Conventional connector 213 provides structural integrity and connects the signal paths and provides continuity of the ground reference layer 205 of the hot pluggable device 240 to the ground reference layer 211 of the electronic device. The conventional connector 213 does not however, provide continuity of the reference layers 203 and 209 as the signal trace crosses connector 213 from the hot pluggable device 240 to the other electronic device 250 because an attempt to electrically connect reference layer 209 to reference layer 203 in a conventional device would likely damage the circuitry of one or both of the devices, possibly causing the voltage modules to overheat to dangerous levels. Although the part 213 is discussed herein in terms of being a conventional connector, the 213 shown in the figures may be the general boundary of the connector, rather than the connector itself. The connector may not necessarily be rectangular, instead taking any shape or crossection suitable for connecting the devices. Conventional board design practice to mitigate signal degradation associated with disparate voltage reference layers 203 and 205 is to decouple the reference using discrete capacitors at the connector itself. Because capacitors have limited frequency response, connector and capacitor layout constraints limit the number of capacitors that can be used in this location and typically all signals transitions see the "connector" discontinuity simultaneously, the current practice does a poor job of reducing signal degradation. The various embodiments disclosed herein overcome this drawback.

Figure 3A:
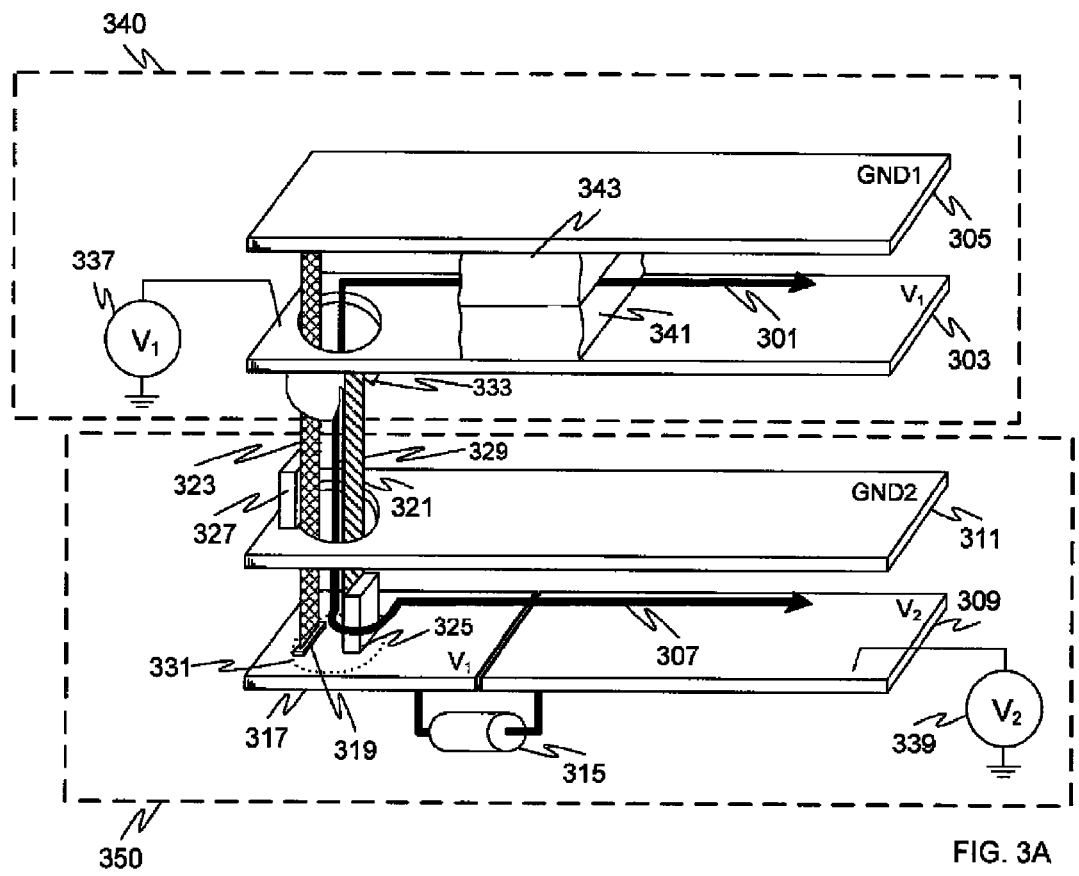
FIGS. 3A and 3B depict two views of a circuitry configuration according to various embodiments of the invention for routing a signal through a connector from a hot pluggable device to mitigate parasitic effects.
Figure 3B:
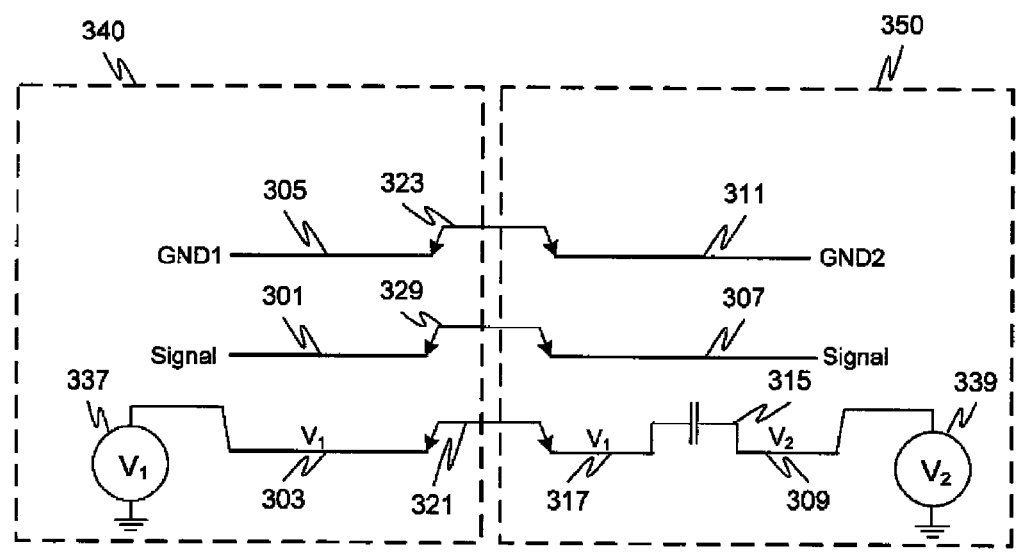

FIGS. 3A and 3B depict two views of a circuitry configuration according to various embodiments that mitigates parasitic effects of a signal routed from a hot pluggable device 340 through a connector to an electronic device 350. FIG. 3A depicts hot pluggable module 340 above the electronic device 350, with a connector interconnecting the signal traces and references layers of each device. FIG. 3B depicts a circuit diagram of hot pluggable device 340 above the electronic device 350 side by side with common reference numbers indicating corresponding parts of the two drawings. One feature of FIGS. 3A-3B is that the reference layer 317 of electronic device 350 is connected via the connector to reference layer 303 of the hot pluggable device 340 rather than being connected to voltage regulator module 339 of the electronic device 350. In this way, when the hot pluggable device 340 is connected to the electronic device 350 the voltage regulator module 337 maintains reference layer 317 at voltage $V_1$. Regarding the voltage regulators, the voltage regulator 337 is said to be associated with the hot pluggable device 340 and the voltage regulator 339 is said to be associated with the electronic device 350. This means that the voltage regulator 337 maintains a voltage of $V_1$ on the hot pluggable device 340, and the voltage regulator 339 maintains a voltage of $V_2$ on the electronic device 350. The voltage regulators may not necessarily be located on the device with which they are associated, and instead may be connected via a power line or buss. In the exemplary configuration of FIGS. 3A-3B, the voltage regulator 339 (which is associated with electronic device 350) is not connected to the hot pluggable device 340.

The signal trace 301 of hot pluggable device 340 is connected to signal trace 307 of the electronic device 350 by a signal trace 329 within the connector. The signal traces are typically positioned between two reference layers. Signal trace 301 is positioned between reference layers 303 and 305 on the hot pluggable device 340. Signal trace 307 is positioned between reference layers 317 and 311 at portions of the electronic device 350 near the connector leading from the hot pluggable device 340. Signal trace 307 is positioned between reference layers 309 and 311 at other portions of the electronic device 350. The reference layer 317 of the electronic device 350 does not have a voltage regulator on the electronic device 350. The reference layer 317 of the electronic device 350 is electrically connected to reference layer 303 of the hot pluggable device. As such, reference layer 317 of the electronic device 350 is kept at voltage $V_1$ by voltage regulator module 337 of the hot pluggable device. Reference layer 317 and reference layer 309 are both part of the electronic device 350 but are not directly electrically connected to each other such that DC current can flow between these two layers. Instead, reference layer 317 and reference layer 309 may be connected together with one or more decoupling capacitors such as capacitor 315 of FIGS. 3A-3B. The decoupling capacitor 315 blocks the DC voltage of the voltage regulators from passing through it, but passes non-DC signals and serves as a return current path for transient currents. The respective voltages of voltage regulator modules 337 of the hot pluggable device 340 and 339 of the electronic device 350 need not be the same, or even approximately the same. In some embodiments voltage regulator modules 337 and 339 may have similar, but different, voltage levels (e.g., within 5%, 15%, 20%, 75%, 200%, etc.) while in other embodiments these two voltage regulators may have voltages that differ considerably (e.g., differ by a factor of 10 or more).

The signal traces may be spaced apart from the voltage layers by insulative layers, for example, dielectric layers 341 and 343. In order to show details of the signal traces in the figure only a portion of the dielectric layers 341 and 343 is shown. Insulative layers may also be used to position signal trace 307 between reference layers in the electronic device 350, and to position the signal trace 329 within the connector, as well. In practice the dielectric layers may run the length of the signal trace to provide support and insulate it from the reference layer, as needed. Depending upon the particular configuration, the signal traces may be placed midway between the reference layers, or else some other given distance in between the layers, to produce the desired signal transmission effect for a given type of signal. In the example illustrated in this figure signal trace is intended to be positioned midway between the corresponding reference layers of each device and the connector. That is, midway between reference layers 321 and 323, reference layers 303 and 305, and reference layers 311 and 309/317. In some embodiments the geometry of the connector may differ from that of the devices, and the geometry of the devices may differ from each other. In other embodiments the geometry of the reference layers and signal traces may be maintained from one device to the other and/or through the connector. However, regardless of whether the geometry or positioning of the signal traces and reference layers is kept consistent between the devices, it is often desirable to keep the impedance consistent along the signal path.

The connector may also have a pair of reference layers 323 and 321 positioned on either side of the signal trace 329 passing through the connector to complete the signal path from the electronic device 350 to the hot pluggable device 340. Such reference layers within the connector may help to reduce parasitic effects. The reference layers of the connector may either have a similar geometry to one or the other of the devices, or may otherwise be configured to provide a comparable amount of impedance as the signal path in the devices. In the embodiment depicted in FIG. 3A, the connector includes reference layer 321 which ties reference layer 317 of the electronic device 350 to reference layer 303 of the hot pluggable device 340 by making contact with electrode 325 which is connected to layer 317. Since reference layer 303 of the hot pluggable device 340 is maintained at voltage $V_1$ by voltage regulator 337, the reference layer 317 of the electronic device 350 will also be maintained at voltage $V_1$ when the hot pluggable device 340 is connected to the electronic device 350. The reference layer 317 is isolated from reference layer 309, except for a decoupling capacitor 315 (more than one decoupling capacitor may be used). Since the voltage regulators 337 and 339 provide a direct current (DC) output, there will be no short circuit across the decoupling capacitor 315, keeping the two reference layers 309 and 317 isolated.

Unlike the voltage reference layers 303 and 309 (and 317 when a hot pluggable device is connected), the ground reference layers 305 and 311 are not driven by voltage regulator modules. Therefore, ground reference layer 305 and ground reference layer 311 may be directly connected to each other via the connector. In FIGS. 3A-3B ground reference layer 311 is directly connected to ground reference layer 305 via the ground reference layer 323 of the connector which removably comes into contact with electrode 327 when the connector is inserted into the electronic module 350. Note that reference layer 323 passes through a cutout in reference layer 303 so as to avoid making electrical contact with it as the reference layer 303 goes into the connector. Similarly, reference layer 321 passes through a cutout in reference layer 311. The cutout portions of a reference layer may be filled with an insulative material to keep the reference layer passing through it (which is at a different potential) from shorting across. The reference layer 323 is electrically insulated from reference layer 309. In some implementations an insulative material 319 may be provided to keep reference layer 323 insulated from reference layer 309, while in other implementations the reference layer 323 simply does not extend all the way down to the reference layer 309.

The connector typically has some sort of housing, a cutaway portion of which is shown as housing 333. The connector housing 333 may be configured either as part of the hot pluggable device 340, or as part of the electronic device 350, depending upon the applicable standards or specifications or engineering requirements for the connector. In FIG. 3A the cutaway portion of housing 333 is shown as part of the hot pluggable device 340, for illustrative purposes. Typically, there is a corresponding housing on the other device that either fits inside of or around the connector housing 333 in order to align the contacts and make good electrical contact. The connector housing 333 may comprise male contacts, as shown in FIG. 3A, or female contacts, depending upon the particular design requirements or preferences of the implementation. The connector housing 333 may extend partially into the electronic device 350, or fully into the device through cutouts in one or both of the voltage layers 311 and 309. The housing generally provides some structural support for the electrical contacts it contains, that is, the voltage layers 321 and 323 of the connector and the signal trace 329. In some implementations the housing itself may serve as the ground layer connector between the hot pluggable device 340 and the electronic device 350.

The housing 333 may define a crossection 331 of the connector, for example, as indicated by the dotted line 331 on ground layer 317. The crossection 331 may be defined by the inner surface of the housing 333, by the outer surface of the housing 333, or by a predefined distance from one of the surfaces (e.g., +0.5 inches outside the outer surface of housing 333, or the like). The area of reference layer 317 (which is not driven by a voltage regulator of the electronic device 350) may be defined in terms of the crossection 331 of the connector. For example, reference layer 317 may be said to be in a first portion of the electronic device 350 that encompasses the crossection 331 (e.g., the dotted line). Similarly, the reference layer 309 may be said to be in a second portion of the electronic device that does not encompass or intersect the crossection 331, since, in the embodiment illustrated in FIG. 3A, no portion of reference layer 309 intersects or overlaps the crossection 331. The positioning of reference layers 309 and 317 may be defined in terms of each other. For example, in some embodiments the reference layers 309 and 317 may be located within the same layer so that they share a parallel boundary to each other, and would intersect if extended to overlap each other. In such an embodiment the shared parallel boundary would be pushed away from the connector region and by design, located where more decoupling capacitors could be used than what was possible near the connector. The shared boundary might also be designed using minimum plane-to-plane separation between reference layers 309 and 317 so as to further lessen the electrical discontinuity. And finally the shared boundary might also be designed so that not all signal traces in wide busses using approximately equal length and simultaneously timed signals, crossed the discontinuity simultaneously (for example, at nearly equal points along the signal trace length). In other embodiments the reference layers 309 and 317 are not be located within the same layer, as shown in FIGS. 4A-4B.

Figure 4A:
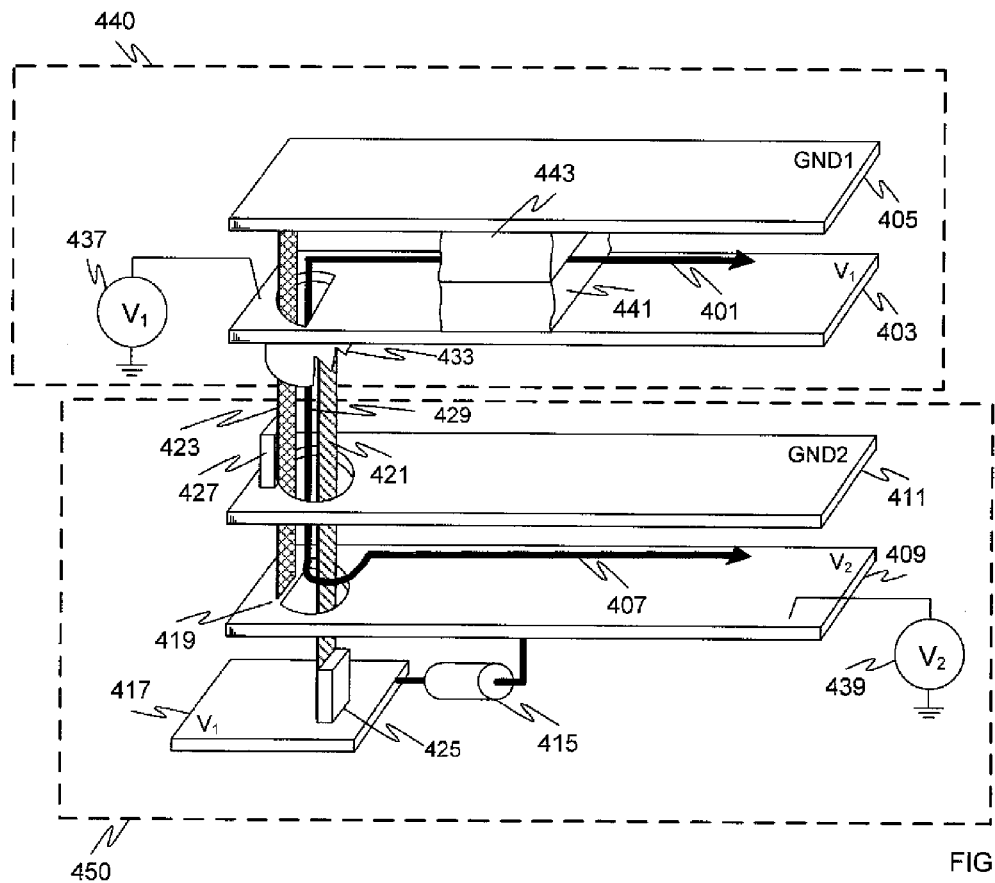
FIGS. 4A and 4B depict two views of another circuitry configuration according to embodiments of the invention for routing a signal through a connector from a hot pluggable device to mitigate parasitic effects.
Figure 4B:
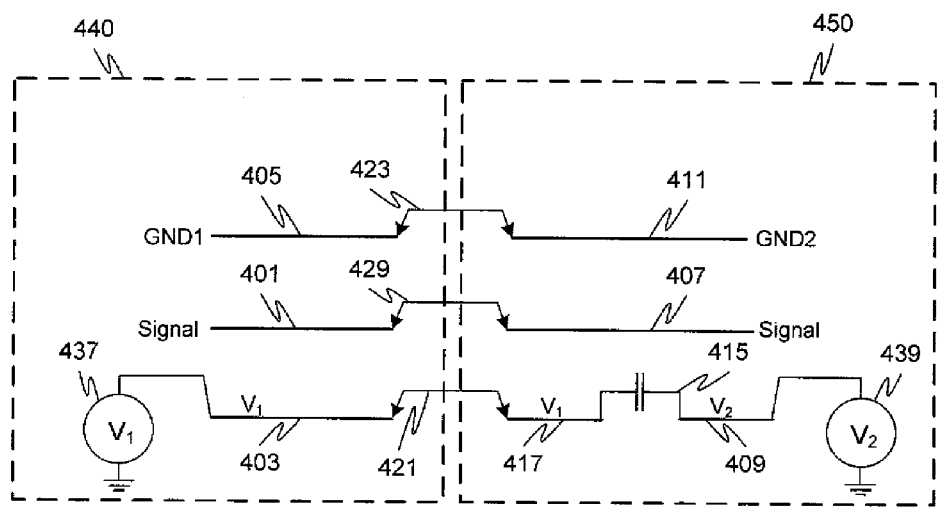

FIGS. 4A-4B depict two views of a circuitry configuration according to various embodiments that mitigates parasitic effects of a signal routed from a hot pluggable device 440 through a connector to an electronic device 450. The embodiment of FIGS. 4A-4B differs from that of FIGS. 3A-3B in that the reference layers 409 and 417 are not located in the same layer. Instead, the signal trace 429 passing through the connector is routed away from the pair of reference layers 421-423 of the connector and onto reference layer 409 of the electronic device which is held to voltage $V_2$ by the voltage regulator 439. The reference layer 421 of the connector is configured to pass through reference layer 409 without making electrical contact in order to maintain reference layer 417 to voltage $V_1$ of the voltage regulator module 437. Hence, like FIGS. 3A-3B, one feature of FIGS. 4A-4B is that the reference layer 417 of electronic device 440 is connected via the connector to reference layer 403 of the hot pluggable device 440 rather than being connected to the voltage regulator module 439 of the electronic device 440. In some implementations an insulative material 419 may be provided to keep reference layer 4423 insulated from reference layer 409, while in other implementations the reference layer 423 simply does not extend all the way down to the reference layer 409.

Regarding FIG. 4B which depicts the circuit diagram for FIG. 4A, this figure is similar to FIG. 3B since the circuit diagram is similar for the embodiments even though the physical configuration differs. In FIGS. 4A-4B similar reference numbers are used as compared to FIGS. 3A-3B indicating similar functions and connections for many of the various components. In both cases the voltage reference layer from the hot pluggable device is physically extended onto the electronic device to enable the use of more and electrically better placed decoupling capacitors. For the physical implementation depicted in FIGS. 3A-3B these decoupling capacitors are placed along the shared boundary between reference layers 317 and 309. For the physical implementation depicted in FIGS. 4A-4B these decoupling capacitors are placed in the overlapping area between reference layer 417 and 409. The two embodiments have some unique advantages. In the physical implementation depicted in FIGS. 3A-3B the location of the discontinuity along the signal traces can be managed and the size of the physical discontinuity can be reduced to the minimum allowed plane to plane separation. In the physical implementation depicted in FIGS. 4A-4B high frequency plane-to-plane capacitance inherently improves decoupling between the disparate reference layers.

Both embodiments can be modified by reversing the roles of the hot pluggable and electronic devices. That is the voltage reference layer of the electronic device can instead be physically extended onto the hot pluggable device to similarly enable the use of more and electrically better placed decoupling capacitors. What reference layer should be extended onto what device will often be a determined by which card has the most free design area for decoupling capacitor placement. Moreover a physical mix of all embodiments could be implemented across a wide connector when the available design area on the electronic and hot pluggable devices favored such an application.

Figure 5:
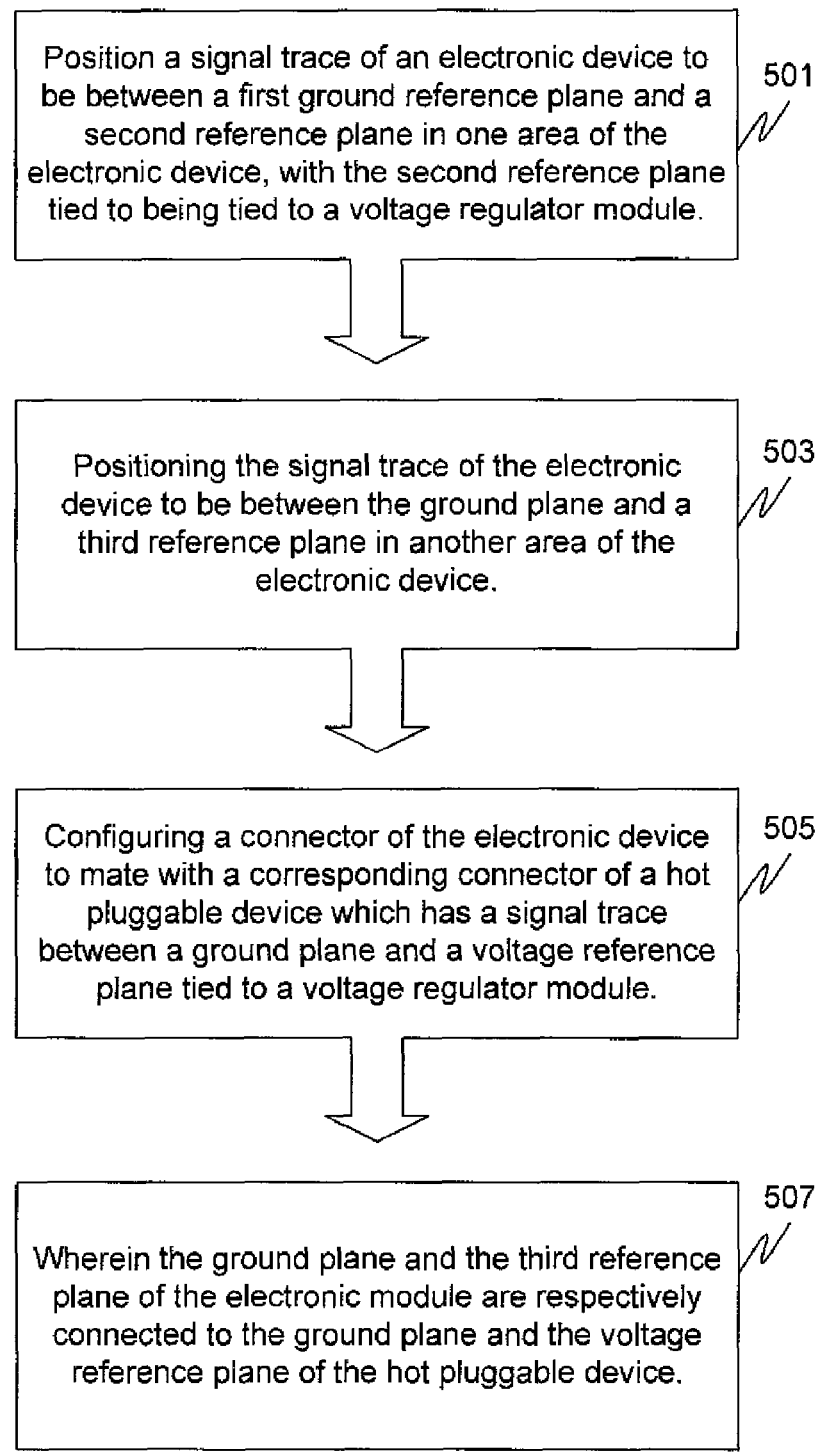
FIG. 5 is a flowchart for creating various embodiments of the invention.

FIG. 5 is a flowchart 500 outlining a method for creating various embodiments. The flowchart discloses the positional interrelationship between different components of various embodiments, but does not necessarily describe the order in which the device is constructed or the timing of depositing the components on the device. The device components or other elements may be constructed in a different order than mentioned in conjunction with FIG. 5 in the following paragraphs, or than the order of the elements of the claims.

In 501 a signal trace is positioned between a first reference layer and a second reference layer of the first device. The first reference layer of the first device in this example is a ground reference layer. The second reference layer of the first device is connected to a voltage regulator module of the first device so as to maintain it at a given voltage. For example, the first reference layer could be reference layer 311 of FIG. 3A, the second reference layer could be reference layer 309 connected to voltage regulator module 339, and the signal trace could be signal trace 307. Upon completing 501 the method proceeds to 503.

In 503 the signal trace is positioned between the first reference layer and a third reference layer of the first device. The third reference layer of the first device is not necessarily a ground layer, but is not tied to a voltage regulator of the first device. Instead, the first device's third reference layer is tied, via a connector, to a reference layer of a second device which is connected to a voltage regulator of the second device. For example, the third reference layer could be reference layer 317 which, when the connector is connected, is tied to reference layer 303 of the second device, the reference layer 303 being maintained at a voltage $V_1$ by the second device's voltage regulator 337. Upon completing 503 the method proceeds to 505.

In 505 a connector is configured to electrically connect the signal trace of the electronic device with a signal trace of the second device. The first layer of the first device (e.g., a ground layer) is connected to a ground layer of the second device. As mentioned above, the first device's third reference layer is tied to a voltage reference layer of a second device by the connector, with that voltage reference layer being driven by a voltage regulator of the second device. In this way, when the second device is connected to the first device, the third reference layer (the layer not connected to a voltage regulator of the first device) is maintained at the voltage of the second device's voltage regulator. The connector may have a housing for structural support, and the portions of the signal traces and reference layers for either the first device or the second device may either be male connectors, female connectors, a combination of male and female, or any other type of connector configured to make electrical contact (e.g., flat connector terminals, springloaded connector terminals, etc.). Upon completing 505 the method proceeds to 507.

In 507 when the second device is connected to the first device the ground layer of the first module is connected to a ground layer of the second module and the third reference layer of the first device is maintained at a voltage of the second device by the second device's voltage regulator module. Since the second reference layer of the first device is connected to a voltage regulator of the first device, the second reference layer cannot be directly connected to the voltage reference layer of the second device. The second reference layer of the first device, a voltage reference layer, can be coupled to the voltage reference layer of the second device using a decoupling capacitor or multiple decoupling capacitors.

Figure 6:
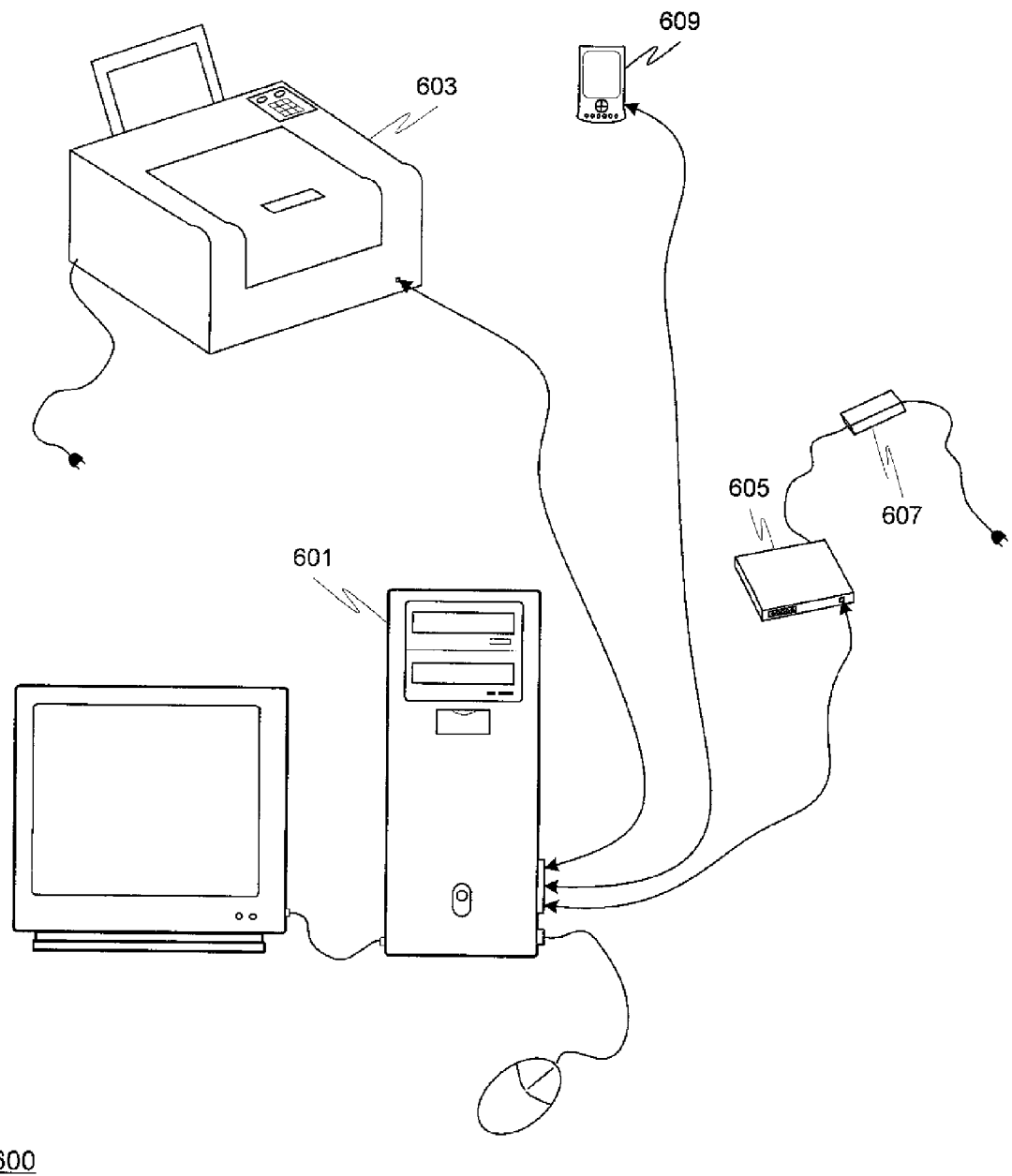
FIG. 6 depicts an exemplary system suitable for incorporating various embodiments.

FIG. 6 depicts an exemplary system suitable for incorporating various embodiments. Various embodiments may be implemented in any sort of electronic device configured to be connected to a hot pluggable device. For example, an embodiment may be implemented in a computer system 601 that may be connected to hot pluggable peripherals such as a printer 603, a hard drive 605, and/or a personal digital assistant (PDA) 609. In each instance the hot pluggable device has its own voltage regulator. For example, the printer 603 and hard drive 605 are connected to an AC outlet and contain a power supply for converting the AC current to DC as needed for the internal circuitry of the devices. On the other hand, PDA 609 is battery powered, the batteries being connected to a voltage regulator module of the PDA 609. The various embodiments are not limited to the devices depicted in FIG. 6, but rather, may be implemented in any sort of electronic devices supporting hot pluggable characteristics.

The various embodiments above are discussed in terms of being implemented with reference layers and ground layers. In some implementations the layers may be planer layers, that is, reference planes or ground planes. These planes are planar in a circuitry sense rather than a strict mathematical sense. That is, the reference planes and ground planes tend to be flat and are positioned a finite distance from each other in given portions of the devices. Regarding the voltage regulators, the voltage regulator 337 is said to be associated with hot pluggable device 340 and the voltage regulator 339 is said to be associated with electronic device 350. This means that the voltage regulator 337 maintains a voltage of $V_1$ on the hot pluggable device 340, and the voltage regulator 339 maintains a voltage of $V_2$ on the electronic device 350. However, in some implementations the voltage regulators may not necessarily be located on the device with which they are associated, and instead may be connected via a power line or buss. In such instances, as between two devices, the voltage regulator is said to be associated with the device most closely electrically connected to the voltage regulator. For example, the voltage regulator 337 maintains reference layer 303 at a voltage of $V_1$. But the reference layer 317, which is connected to reference layer 303, is also maintained at a voltage of $V_1$ via its connection to reference layer 303. The voltage regulator 337 is said to be associated with the hot pluggable device 340 since voltage regulator 337 is more closely electrically connected to it (the connection to layer 303) than to the electronic device 350 (reference layer 317 is connected via reference layer 303 to the voltage regulator 337).

Various activities may be included or excluded as described above, or performed in a different order, with the rest of the activities still remaining within the scope of at least one exemplary embodiment. For example, block 501 discusses the method in terms of positioning a signal trace of an electronic device in between a first ground reference plane and a second reference plane in one area of the first device, with the second reference plane tied to a voltage regulator module of a second device through a connector. In practice, the various layers may be deposited (or otherwise positioned) from the bottom layer up, or in any other order convenient to the manufacturer or foundry where the device circuitry is created.

The use of the word "exemplary" in this disclosure is intended to mean that the embodiment or element so described serves as an example, instance, or illustration, and is not necessarily to be construed as preferred or advantageous over other embodiments or elements.

In this disclosure, when the term first reference layer and second reference layer are used, it does not necessarily imply that the two reference layers are located on the same device simply because the words first and second are used. For example, the claims include a first ground layer of the first device and also include a second ground layer of the second device. In this way, the claims can thereafter recite simply a first ground layer and/or a second ground layer (or reference layer) without requiring subsequent recitations of which device the reference layer belongs to (e.g., reciting the first ground layer rather than the ground of the first device).

In this disclosure the term "removably connected" means that a device (or trace, or reference level, etc.) is configured to be connected and disconnected by a user. This may be achieved through the use of a removable connector, or by designing parts and electrodes that fit together and electrically connect, yet are readily plugged and unplugged (or screwed/unscrewed, or the like). Parts that are removably connected are typically not soldered together, but may, in some instances, be screwed together or otherwise fastened by a latch, a snap, a spring loaded catch, or other manually operated physical connector.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A first device (350) comprising:
   a first signal trace (307) configured to be removably connected to a second signal trace (301) of a second device (340);
   a first ground layer (311) configured to be removably connected to a second ground layer (305) of the second device (340);
   a first reference layer (309) opposing the first ground layer (311) and configured in a first portion of the first device to be on an opposite side of the first signal trace (307) from the first ground layer (311), the first reference layer (309) being connected to a first voltage regulator (339) associated with the first device (350); and
   a second reference layer (317) opposing the first ground layer (311) and configured in a second portion of the first device (350) to be on the opposite side of the first signal trace (307) from the first ground layer (311), the second reference layer (317) configured to be removably connected to a third reference layer (303) of the second device (340).

2. The first device of claim 1, wherein the third reference layer of the second device is connected to a second voltage regulator module associated with the second device, the second reference layer of the first device being removably connected to the second voltage regulator via the third reference layer of the second device.

3. The first device of claim 2, wherein the first voltage regulator module may or may not maintain the second voltage regulator module's value.

4. The first device of claim 2, wherein the first portion of the first device does not encompasses a crossection of the connector.

5. The first device of claim 4, wherein the second portion of the first device does encompass the crossection of the connector.

6. The first device of claim 1, further comprising:
   a connector through which a third signal trace passes, said connector being configured to removably connect the first signal trace of the first device to the second signal trace of the second device.

7. The first device of claim 1, wherein the first reference layer is a first reference plane and the second reference layer is a second reference plane.

8. The first device of claim 1, wherein the first signal trace is positioned in between the second reference layer and the first ground layer in said second portion of the electronic device.

9. The first device of claim 8, further comprising:
a first dielectric layer between the first signal trace and the first reference layer; and
a second dielectric layer between the first signal trace and the first ground layer.

10. The first device of claim 1, wherein the first voltage regulator module is not electrically connected to the second reference layer.

11. The first device of claim 1, further comprising:
a decoupling capacitor connecting the first reference layer to the second reference layer.

12. A connector comprising:
a connector signal trace configured to removably connect a first signal trace of an first module to a second signal trace of a second device, the first signal trace being positioned in a second portion of the first device in between a first ground layer and a second reference layer which is connected to a second voltage reference module;
a connector ground layer configured to removably connect the first ground layer of the first device to a second ground layer of the second device; and
a connector reference layer configured to removably connect a second reference layer of the first device to a third reference layer of the second device, the second reference layer opposing the first ground layer on an opposite side of the first signal trace from the first ground layer, said third reference layer being connected to a second voltage reference module of the hot pluggable device.

13. The connector of claim 12, wherein the connector is configured as part of the electronic module.

14. The connector of claim 12, wherein the second portion of the first device encompasses a crossection of the connector.

15. A method for configuring a first device (350), the method comprising:
positioning a first signal trace (307) within a second portion of the first device (350) to be between a second reference layer (317) and a first ground layer (311) of the first device (350), said first signal trace (307) being removably connected to a second signal trace (301) of a second device (340);
positioning the first signal trace (307) within a first portion of the first device (350) to be between a first reference layer (309) and the first ground layer (311) of the first device (350);
connecting the first reference layer (309) to a first voltage regulator module (339) associated with the first device (350); and
providing a connector configured to removably connect the first signal trace (307) of the first device (350) to second signal trace (301) of the second device (340), to removably connect the first ground layer (311) of the first device (350) to a second ground layer (305) of the second device (340), to removably connect the second reference layer (317) of the first device (350) to a third reference layer (303) of the second device (340);
wherein the third reference (303) layer of the second device (340) is connected to a second voltage regulator (337) module associated with the second device (340).

16. The method of claim 15, wherein the first signal trace is positioned in between the first reference layer and the first ground layer in said first portion of the first device.

17. The method of claim 16, further comprising:
providing a first dielectric layer between the first signal trace and the first reference layer; and
providing a second dielectric layer between the first signal trace and the first ground layer.

18. The method of claim 15, wherein the first voltage regulator module is not electrically connected to the second reference layer.

19. The method of claim 15, wherein the first voltage regulator module maintains a voltage value different from but within 15% of the second voltage regulator module's value.

20. The method of claim 15, further comprising:
connecting a decoupling capacitor (315) between the first reference layer (309) and the second reference layer (317), said decoupling capacitor (315) being configured to block DC voltage from passing between the first voltage regulator module (339) and the second voltage regulator module (337).

* * * * *